United States Patent [19]

Bronstert et al.

[11] 4,198,241
[45] Apr. 15, 1980

[54] PHOTOPOLYMERIZABLE COMPOSITION FOR THE MANUFACTURE OF PRINTING PLATES AND RELIEF PLATES

[75] Inventors: Bernd Bronstert, Frankenthal; Werner Küesters, Ludigshafen; Mong-Jon Jun, Speyer; Guenter Wallbillich, Schifferstadt, all of Fed. Rep. of Germany

[73] Assignee: BASF Aktiengesellschaft, Fed. Rep. of Germany

[21] Appl. No.: 907,007

[22] Filed: May 18, 1978

[30] Foreign Application Priority Data

May 18, 1977 [DE] Fed. Rep. of Germany ....... 2722421
Dec. 31, 1977 [DE] Fed. Rep. of Germany ....... 2759163

[51] Int. Cl.$^2$ .............................................. G03C 1/68
[52] U.S. Cl. ............................. 430/284; 204/159.18; 204/159.23; 204/159.24; 430/306
[58] Field of Search ................ 96/115 P, 115 R, 35.1; 204/159.18, 159.24, 159.23

[56] References Cited

U.S. PATENT DOCUMENTS

| | | | |
|---|---|---|---|
| 3,024,180 | 3/1962 | McGrew | 96/115 P |
| 3,157,505 | 11/1964 | Notley | 96/115 P |
| 3,615,619 | 10/1971 | Wilhelm et al. | 96/115 P |
| 3,787,212 | 1/1974 | Heimsch et al. | 96/115 P |
| 3,827,957 | 8/1974 | McGinnis | 96/115 P |
| 3,885,964 | 5/1975 | Nacci | 96/115 P |
| 3,991,275 | 11/1976 | Shahidi et al. | 96/115 P |
| 4,053,317 | 10/1977 | Naka et al. | 96/115 P |
| 4,054,719 | 10/1977 | Cordes | 96/115 P |
| 4,113,592 | 9/1978 | Rybny et al. | 96/115P |

*Primary Examiner*—Jack P. Brammer
*Attorney, Agent, or Firm*—Keil & Witherspoon

[57] ABSTRACT

A photopolymerizable composition for the manufacture of printing plates and relief plates, based on a mixture, containing a photoinitiator, of photopolymerizable olefinically unsaturated monomers and a polymeric binder, contains up to 0.1% by weight of an etherified thioanthraquinone for improving the relief image in the production of relief plates.

The composition advantageously also contains a small amount of an organic tertiary amine or of an aromatic α-ketocarboxylic acid or its ester and/or of an inhibitor, e.g. the salt of an organic N-nitrosohydroxylamine.

6 Claims, No Drawings

PHOTOPOLYMERIZABLE COMPOSITION FOR THE MANUFACTURE OF PRINTING PLATES AND RELIEF PLATES

The present invention relates to an improved photopolymerizable composition for the manufacture of printing plates and relief plates, which consists essentially of a mixture of at least one non-polymeric compound, containing at least one olefinically unsaturated photopolymerizable double bond, and an organic polymeric binder compatible with the said compound, and which further contains small amounts of certain organic compounds to improve the relief image whilst providing an advantageous exposure range, especially to improve the depth of shadow wells in the manufacture of relief plates.

Photopolymerizable compositions for the manufacture of printing plates and relief plates have frequently been disclosed, and both fluid and solid compositions can be used. For example, French Pat. No. 1,520,856 discloses a solid resin composition based on a mixture of polyamides with compatible olefinically unsaturated monomers, which composition contains a photoinitiator and a thermal polymerization inhibitor and is used for the manufacture of relief printing plates by imagewise exposure of layers of the composition and subsequent washout of the unexposed areas of the layers with a developer solution. If, for example, relief printing plates are manufactured, using such a conventional composition, with a relief height of from about 0.5 to 1 mm, which is the one usually employed in the printing trade, the plates, because of the relatively high degree of scatter of the UV light during imagewise exposure, in most cases do not exhibit the desired sharp relief image and frequently have side walls which are not steep enough.

It is known that improved relief printing plates can be obtained by using certain dodges during exposure of the photopolymer plates through the image-bearing negative; employing multi-layer photopolymer plates; providing other layers, which influence the sidewall structure of the relief, under the actual photopolymer layer; or adding an absorbent dye to the photopolymer layer. However, these processes are involved or have a rather adverse effect on the light sensitivity of the photopolymer layers.

It is an object of the present invention to provide photopolymerizable compositions containing small amounts of chemical additives, which compositions, when used for the conventional manufacture of relief plates, give an improved relief image as a result of a reduction in the undesirable polymerization in the umbra of fine opaque areas of the image-bearing transparency, whilst providing an advantageous exposure range and showing no substantial decrease in light sensitivity.

We have found, surprisingly, that this object is achieved and that photopolymerizable compositions for the manufacture of printing plates and relief plates, based on a mixture, containing a photoinitiator, of at least one non-polymeric compound containing at least one olefinically unsaturated photopolymerizable double bond, and at least one organic polymeric binder compatible with the said compound, give substantially improved relief images if there is homogeneously distributed in the composition from about 0.001 to 0.1 percent by weight, and especially from 0.01 to 0.05 percent by weight, based on the composition, of an etherified thioanthraquinone of the formula

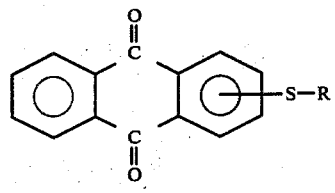

where R is alkyl of 1 to 12 carbon atoms, or alkyl of 1 to 8 carbon atoms which is substituted by a free, etherified or esterified hydroxyl group or an alkoxycarbonyl group, or is phenyl which is unsubstituted or substituted, especially by alkyl, alkoxy, hydroxyalkyl or alkoxyalkyl.

Suitable etherified thioanthraquinones are, in particular, the ethers of 2-thioanthraquinone. Particularly suitable compounds are the hydroxyalkyl ethers, where alkyl is of 1 to 4 carbon atoms, and their derivatives in which the hydroxyl groups, which should preferably not be on the carbon bonded to the sulfur, are etherified with an alcohol of 1 to 8 carbon atoms (ie. the hydrogen of the hydroxyl group is replaced by, for example, alkyl or alkoxyalkyl, where alkoxy is of 1 to 7 carbon atoms) or are esterified by a carboxylic acid of 1 to 8 carbon atoms, especially a monocarboxylic acid. Further very suitable compounds are the alkyl ethers of thioanthraquinone, where alkyl is of 1 to 8 carbon atoms and is substituted by at least one alkoxycarbonyl of 1 to 8 carbon atoms, eg. ethoxycarbonyl or methoxycarbonyl. Further suitable compounds are the phenyl ethers of thioanthraquinone, where phenyl is unsubstituted or is substituted by alkyl of 1 to 4 carbon atoms, alkoxy of 1 to 4 carbon atoms, hydroxyalkyl of 1 to 4 carbon atoms or alkoxyalkyl of 2 to 6 carbon atoms.

Examples of suitable additives according to the present invention are the ethers of 2-thioanthraquinone of the formule I, where R is:

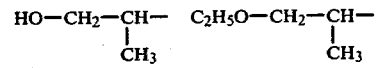

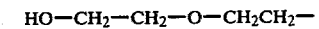

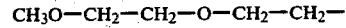

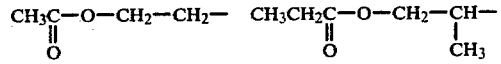

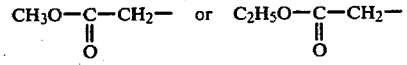

Particularly suitable alkylthioanthraquinones are those where alkyl is of 1 to 8 carbon atoms and especially of 3 to 8 carbon atoms.

Amongst the etherified thioanthraquinones of the formula (I), the propyl-, n-butyl- and isobutyl-thioanthraquinones are preferred, especially 2-butylthio-2-anthraquinone of the formula (II)

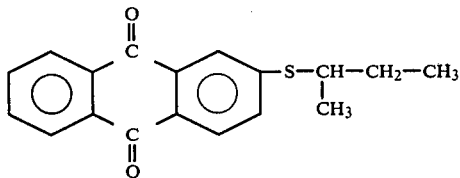
(II)

In many cases it has proved advantageous to use the etherified thioanthraquinones not by themselves, but conjointly with from 0.01 to 1 percent by weight, based on the total composition, of a synergistic agent, eg. an organic amine as described in U.S. Pat. No. 3,759,807 or an α-ketocarboxylic acid or its ester. Very suitable synergistic agents are tertiary amines, eg. morpholine, and especially aliphatic tertiary amines which contain hydroxyl groups, eg. dimethylethanolamine, diethanolamine, triethanolamine and particularly methyldiethanolamine. Amongst the α-ketocarboxylic acids and their esters, the aromatic α-ketocarboxylic acids and their alkyl esters, where alkyl is of 1 to 18 carbon atoms, are very suitable and in most cases even more active than the above amines. Phenylglyoxylic acid and its alkyl esters, amongst which the methyl ester is to be singled out particularly, are preferred. They may be added to the composition in any amount, and if large amounts are used they have a certain plasticizing action. In general, the amounts added are from 0.05 to 1 percent by weight, based on the total composition.

It has also proved very advantageous additionally to introduce into the composition a conventional polymerization inhibitor, eg. a nitrosamine, N-nitrosohydroxylamine derivative, phenol or phenolether, provided these do not substantially increase the minimum exposure time, or provided such an increase can be tolerated. A particularly advantageous effect is achieved by the presence of a salt of an organic N-nitrosohydroxylamine, such as one of the N-nitrosohydroxylamine salts described in British Pat. No. 1,209,232, of the formula (III)

(III)

where R is an organic radical and especially a hydrocarbon radical of 1 to 8 carbon atoms, for example alkyl or cycloalkyl (eg. methyl, isopropyl or butyl, or cyclooctyl or methylolcyclohexyl), benzyl, phenyl or naphthyl and especially cyclohexyl, X is substituted or unsubstituted ammonium or especially a metal, for example sodium, magnesium, cerium, aluminum or especially potassium, and n is a number corresponding to the valency of X.

Amongst the compounds of the formula (III), the sodium and aluminum salts, and especially the potassium salts, of N-nitrosocyclohexyl-hydroxylamine should be singled out particularly. The compound of the formula (III) is advantageously added to the composition in an amount of from 0.02 to 2 percent by weight, and especially from 0.1 to 0.8 percent by weight, based on the composition. The combined use of an etherified thioanthraquinone and phenylglyoxylic acid or one of its alkyl esters, and a compound of the formula (III), especially a metal salt of N-nitrosocyclohexyl-hydroxylamine, has proved particularly advantageous. We have found that, when a thio compound is combined with a nitroso compound of the formula (III), photochemical reaction produces an inhibitor in those areas of the imagewise-exposed layer of photopolymerizable composition where the UV irradiation is most intense, ie. where the light is brightest. In this way, particularly advantageous reliefs with very favorable shadow well depths, the exposure range of the layer of composition being broad, can be obtained.

The photopolymerizable composition contains, as is customary in the art, from 0.01 to 10, and especially from 0.01 to 3, percent by weight, based on the said mixture, of a photoinitiator; the latter can be virtually any of the compounds which on exposure to actinic light can form free radicals capable of initiating polymerization. Examples of suitable photoinitiators are acyloins and acyloin ethers of aromatic diketones and their derivatives, polynuclear quinones, acridine derivatives and phenazine derivatives. Very suitable compounds are benzoin and α-hydroxymethylbenzoin and their alkyl ethers, where alkyl is of 1 to 8 carbon atoms, eg. benzoin isopropyl ether, α-hydroxymethyl-benzoin methyl ether, benzoin tetrahydropyranyl ether and benzoin methyl ether, benzil monoketals, eg. benzil monodimethylketal, benzil monomethylethylketal, benzil mono-methylbenzylketal or benzil mono-neopentylketal.

Suitable organic polymeric binders for the photopolymerizable composition for the manufacture of printing plates and relief plates are those conventionally used for this purpose; the polymer should be compatible with the monomer present and, as is evident to those skilled in the art, should be soluble or dispersible in the developer solution to permit washout of the unexposed and noncrosslinked areas of a layer of the photopolymerizable composition after imagewise exposure. Examples of suitable polymeric saturated or olefinically unsaturated binders are linear polyamides and especially alcohol-soluble copolyamides as described in French Pat. No. 1,520,856, cellulose derivatives, especially those which can be washed out with aqueous alkaline solutions, vinyl alcohol polymers and polymers and copolymers of vinyl esters of aliphatic monocarboxylic acids of 1 to 4 carbon atoms, eg. of vinyl acetate, which have been hydrolyzed to various degrees, vinylpyrrolidone homopolymers and copolymers, polyurethanes, polyether-urethanes and polyester-urethanes, and polyester resins, especially acid polyester resins, for example those described in German Laid-Open Application DOS 2,040,390, and elastomeric diene homopolymers and copolymers, eg. block copolymers comprising butadiene and/or isoprene homopolymer blocks and styrene or α-methylstyrene polymer blocks.

Preferably, a polymeric binder containing a plurality of polar groups, eg. a polyamide, polyurethane, polyvinyl alcohol or vinylpyrrolidone homopolymer or copolymer, is used in the composition.

In general, the mixture contains from about 45 to 90, and especially from 50 to 75, percent by weight of polymeric binder, based on the amount of polymer plus photopolymerizable monomers.

Suitable non-polymeric compounds containing at least one olefinically unsaturated photopolymerizable double bond are the monomers used for photopolymer printing plates, provided they form compatible mixtures with the particular polymeric binder which has been chosen, and provided they boil at above 100° C. under atmospheric pressure. Monomers containing two or more olefinically unsaturated photopolymerizable double bonds, used by themselves, or mixtures of such monomers with monomers containing only one olefinically unsaturated photopolymerizable double bond, are preferred. The type of the monomers used depends substantially on the type of the polymeric binder employed. For example, in the case of mixtures with unsaturated polyester resins, particularly suitable monomers are allyl compounds containing two or more double bonds, eg. diallyl maleate, allyl acrylate, diallyl phthalate, diallyl and triallyl trimellitate and ethylene glycol bis-allylcarbonate, as well as diacrylates and polyacrylates, and dimethacrylates and polymethacrylates, which may be obtained by esterifying diols or polyols with acrylic acid or methacrylic acid, eg. the diacrylates and triacrylates, or dimethacrylates and trimethacrylates, of ethylene glycol, diethylene glycol, triethylene glycol, polyethylene glycol having a molecular weight of up to about 500, 1,2-propanediol, 1,3-propanediol, neopentylglycol (2,2-dimethyl-propanediol), 1,4-butanediol, 1,1,1-trimethylolpropane, glycerol and pentaerythritol, as well as the monoacrylates and monomethacrylates of such diols and polyols, eg. ethylene glycol, diethylene glycol, triethylene glycol and tetraethylene glycol monoacrylate, and monomers containing two or more olefinically unsaturated bonds and also containing urethane groups and/or amide groups, eg. the non-polymeric compounds obtained from aliphatic diols of the above type, organic diisocyanates and hydroxyalkyl acrylates or methacrylates. Further suitable monomers are acrylic acid, methacrylic acid and their derivatives, eg. acrylamide, methacrylamide, N-hydroxymethylacrylamide, N-hydroxymethyl-methacrylamide and acrylates and methacrylates of monoalcohols of 1 to 6 carbon atoms. Mixtures of allyl monomers with diacrylates or polyacrylates are particularly suitable. If mixtures containing a polyamide as the polymeric binder are selected, particularly suitable monomers, amongst the types mentioned, are the diacrylates and polyacrylates, and monomers which in addition to the double bonds contain amide and/or urethane groups, for example acrylamide derivatives, eg. the reaction products of 2 moles of N-hydroxymethyl-acrylamide or N-hydroxymethyl-methacrylamide with 1 mole of an aliphatic diol, eg. ethylene glycol, xylylene-bis-acrylamide or alkylene-bis-acrylamides where alkylene is of 1 to 8 carbon atoms. Water-soluble monomers, eg. hydroxyethyl acrylate, hydroxyethyl methacrylate and monoacrylates, diacrylates, monomethacrylates and dimethacrylates of polyethylene glycols having a molecular weight of from about 200 to 500, are particularly suitable for the manufacture of printing plates which contain polyvinyl alcohol as the polymeric binder and can be developed with aqueous alkaline solution.

The amount of the monomer or the monomers is in general from about 10 to 55, and especially from 35 to 55, percent by weight, based on the amount of polymeric binder plus photopolymerizable monomer, and is determined, inter alia, by the compatibility of the monomers with the polymer and the desired hardness of the resulting printing plate.

The composition can also contain other conventional additives, eg. plasticizers, saturated low-molecular weight compounds containing amide groups, waxes and the like.

Processing of the photopolymerizable composition into photopolymer printing plates having the composition as the relief-forming layer, which is in general from 200 to 800 $\mu$m thick, may be carried out in the conventional manner and depends on the nature of the mixture and on whether the composition is fluid or solid. Processing of the blank material into relief plates is carried out in the conventional manner by imagewise exposure with actinic light, using a light source which has an emission maximum in the absorption range of the photoinitiator, in general in a range of from 300 to 400 nm, or which emits a sufficient proportion of light of this wavelength range, eg. low-pressure, medium-pressure and high-pressure mercury vapor lamps, and superactinic fluorescent tubes. After the imagewise exposure, the unexposed areas of the layer are removed in the conventional manner, either mechanically or, preferably, by washing out with developer solutions, and the resulting printing plates are dried. In some cases it may be advantageous to after-expose the entire relief.

The composition according to the invention, containing etherified thioanthraquinones, is particularly suitable for processes for the manufacture of relief plates and especially relief printing plates from photopolymer plates comprising layers of this composition. According to the invention it is possible to reduce undesired polymerization in the umbra of fine opaque elements of the image-bearing transparency without adversely affecting the light sensitivity to any great extent, and hence to manufacture relief printing plates with improved resolution and with improved shadow well depths, i.e. with a distinctly improved exposure range, even when polymeric binders and/or monomers which scatter light to only a slight degree are present in the composition. The composition according to the invention also permits the manufacture of thick reliefs with favorable shadow well depths.

To better assess the properties of the compositions for the manufacture of relief plates, the following is determined in each case:

et (min): the minimum exposure time in minutes required to reproduce a 3% highlight dot (60 lines/cm screen).

et (max): the maximum exposure time in minutes required to reproduce an isolated opaque dot (in the photographic negative) having a diameter of 380 $\mu$m, for which the shadow well depth $t_z$ just still conforms to the requirement $t_z \geq 70$ $\mu$m.

$\Delta t$ = exposure range in minutes.

$\Delta t$ = et (max)-et (min).

$\Delta t$ (rel) = relative exposure range in percent $$\Delta t \text{ (rel)} = \frac{\text{et (max)} - \text{et (min)}}{\text{et (min)}} \times 100$$

The exposure is in each case carried out at the same distance of 5 cm in the same commercial flat-plate unit using 40 W UV tubes. Satisfactory plates should have a positive exposure range t.

As is shown by Comparative Experiment 1, for example, a printing plate having a composition to which an etherified thioanthraquinone has not been added, the exposure time being 3.5 minutes, prints a 3% highlight dot without difficulty, but since the shadow well depths of the relief are too small (30 $\mu$m), they become plugged with ink relatively rapidly during printing and then also start to print, as a result of which prints of poor quality are obtained. On the other hand, with an exposure time of 2 minutes, sufficiently large shadow well depths are achieved, but, since photocuring is inadequate, a 3% highlight dot cannot be maintained, and as a result prints having a mottled appearance (in the highlights) are obtained. With a photopolymer plate which has a negative exposure range $\Delta t$, a satisfactory printing plate can only be obtained by additional measures, such as by time-consuming opaquing and/or masking at the copying stage. The Examples show how, according to the invention, it is possible to manufacture printing plates which give satisfactory relief images even when the positive relative exposure range is greater than 100%.

In the Examples and Comparative Experiments, parts and percentages are by weight. Parts by weight bear the same relation to parts by volume as the kilogram to the liter.

EXAMPLE 1

0.2% of the aluminum salt of N-nitrosocyclohexylhydroxylamine, 0.01% of a black dye (Color Index No. 12,195) and 0.03% of 2-butylthio-2-anthraquinone (formula II) are added to a 65% strength solution, in methanol, of a mixture of 60% of a copolyamide obtained from adipic acid, hexamethylenediamine, 4,4'-diaminodicyclohexylmethane and $\epsilon$-caprolactam, 25% of the diether obtained from 1 mole of ethylene glycol and 2 moles of N-hydroxymethyl-acrylamide, 13.5% of benzenesulfonamide and 1.5% of benzoin tetrahydropyranyl ether. The solution is cast on to a steel sheet coated with an adhesive and having a reflectance of about 15%, so as to give, after drying at about 70° C., a 680 $\mu$m thick layer of the photopolymerizable composition. The photopolymer printing plate is exposed imagewise through an image-bearing transparency, as described above, and the unexposed areas of the layer are washed out with an alcohol and water mixture. The plate has a minimum exposure time et(min) of 4 minutes and a maximum exposure time of 5 minutes, so that its exposure range $\Delta t$ is +1 minute and its relative exposure range $\Delta t$ (rel) is +25%.

EXAMPLE 2

The procedure followed is exactly as described in Example 1, but 0.16% of N-methyl-N-di-2-hydroxyethylamine is also added to the solution.

The following are found: et(min) 4 min.; et (max) 6.5 min.; $\Delta t$ +2.5 min.; $\Delta t$ (rel) +63%.

EXAMPLE 3

The procedure followed is exactly as described in Example 1, but 0.16% of methyl phenylglyoxylate ($C_6H_5$—CO—COOCH$_3$) is also added to the solution.

The following are found: et (min) 4 min.; et (max) 9 min.; $\Delta t$ +5 min.; $\Delta t$ (rel) +125%.

EXAMPLE 4

The procedure described in Example 3 is followed, but $\beta$-n-butylthioanthraquinone is used as the alkylthioanthraquinone.

The following are found: et (min) 4 min.; et (max) 8 min.; $\Delta t$ +4 min.; $\Delta t$ (rel) +100%.

EXAMPLE 5

The procedure described in Example 1 is followed, but 0.2% of phenylglyoxylic acid $C_6H_5COCOOH$ is also added to the solution.

The following are found: et (min) 4 min.; et (max) 7.5 min.; $\Delta t$ +3.5 min.; $\Delta t$ (rel) +87%.

EXAMPLE 6

The procedure described in Example 3 is followed, but 0.06% of N-nitrosodiphenylamine is employed as the polymerization inhibitor.

The following are found: et (min) 4.5 min.; et (max) 5.5 min.; $\Delta t$ +1 min.; $\Delta t$ (rel) +22%.

COMPARATIVE EXPERIMENT 1 (FOR COMPARISON WITH EXAMPLES 1-6)

The procedure described in Example 1 is followed, but no alkylthioanthraquinone is added.

The following is found: et (min) 3.5 min.; et (max) 2.0 min.; $\Delta t$ −1.5 min.; $\Delta t$ (rel) −43%.

As already indicated above in the description, the relief plates give unsatisfactory printed copies.

COMPARATIVE EXPERIMENT 2 (FOR COMPARISON WITH EXAMPLES 1-6)

The procedure described in Example 1 is followed, but neither alkylthioanthraquinone nor black dye is added.

The following are found: et (min) 2.5 min.; et (max) 0.5 min.; $\Delta t$ −2.0 min.; $\Delta t$ (rel) −80%.

COMPARATIVE EXPERIMENT 3 (FOR COMPARISON WITH EXAMPLES 1-6)

The procedure described in Example 3 is followed, but instead of 0.03% of the alkylthioanthraquinone, 0.03% of 4-methylthiobenzophenone is added.

The following are found: et (min) 3 min.; et (max) 2.5 min.; $\Delta t$ −0.5 min.; $\Delta t$ (rel) −17%.

COMPARATIVE EXPERIMENT 4 (FOR COMPARISON WITH EXAMPLES 1-6)

The procedure described in Example 3 is followed, but instead of 0.03% of the alkylthioanthraquinone, 0.03% of 2-ethylanthraquinone is added.

The following are found: et (min) 4 min.; et (max) 2 min.; $\Delta t$ −2 min.; $\Delta t$ (rel) −50%.

EXAMPLE 7

The procedure described in Example 1 is followed, but 0.2% of the potassium salt of N-nitrosocyclohexylhydroxylamine, 0.03% of 2-butylthio-2-anthraquinone (formula II) and 0.18% of methyl phenylglyoxylate are added to the solution of polyamide, monomer, plasticizer and photoinitiator. No dye is added. The resulting layer of photopolymerizable composition is 500 $\mu$m thick when dry.

The following are found: et (min) 2.25 min.; et (max) > 17 min.; $\Delta t$ > +15 min.; $\Delta t$ (rel) > +660%.

The shadow well depth $t_z$ is 75 $\mu$m after 17 minutes.

COMPARATIVE EXPERIMENT 6 (FOR COMPARISON WITH EXAMPLE 7)

The procedure described in Example 7 is followed, but instead of the alkylthioanthraquinone and methyl phenylglyoxylate, 0.05% of m-dinitrobenzene is added. The thickness of the dry layer is again 500 $\mu$m.

The following are found: et (min) 2.25 min.; et (max) 1.7 min.; $\Delta t$ −0.55 min.; $\Delta t$ (rel) −24%.

EXAMPLE 8

The procedure described in Example 7 is followed, but the amount of added potassium salt of N-nitrosocyclohexylhydroxylamine is 0.6%.

The following are found: et (min) 2.25 min.; et (max) >>20 min.; Δt > +18 min.; Δt (rel) > +800%.

The shadow well depth $t_z$ is 170 μm after 17 minutes.

EXAMPLE 9

The procedure described in Example 3 is followed, but a layer which is 200 μm thick after drying is produced.

The following are found: et (min) 2 min.; et (max) 20 min.; Δt +18 min.; Δt (rel) +900%.

COMPARATIVE EXPERIMENT 7 (FOR COMPARISON WITH EXAMPLE 9)

The procedure described in Example 9 is followed, but no alkylthioanthraquinone, methyl phenylglyoxylate or dye is added. The thickness of the layer after drying is again 200 μm.

The following are found: et (min) 1.5 min.; et (max) 0.5 min.; Δt < −1 min.; Δt (rel) −67%.

EXAMPLE 10

The procedure described in Example 3 is followed, but the layer produced is 800 μm thick after drying.

The following are found: et (min) 5 min.; et (max) 6 min.; Δt +1 min.; Δt (rel) +20%.

COMPARATIVE EXPERIMENT 8 (FOR COMPARISON WITH EXAMPLE 10)

The procedure described in Example 10 is followed, but no alkylthioanthraquinone, methyl phenylglyoxylate or dye is added. The thickness of the layer after drying is again 800 μm.

The following are found: et (min) 4 min.; et (max) 1 min.; Δt −3 min.; Δt (rel) −75%.

EXAMPLE 11

0.005 part of 2-butylthio-2-anthraquinone (formula II) and 0.03 part of methyl phenylglyoxylate are mixed into a 65% strength aqueous solution of 57 parts of polyvinyl alcohol, 4 parts of the diether obtained from 1 mole of ethylene glycol and 2 moles of N-hydroxymethyl-acrylamide, 37.4 parts of 2-hydroxyethyl methacrylate, 1.5 parts of benzil monodimethylketal and 0.1 part of 2,6-di-tert.-butyl-p-cresol. The solution is cast onto a sheet metal support coated with an adhesive so as to give, after drying at room temperature (6–8% residual humidity), a 500 μm thick layer of the composition. After a preexposure, imagewise exposure is effected through an image-bearing transparency, as described in the text preceding the Examples. The unexposed areas are washed out with water at 40° C., and the relief plate obtained is dried for 4 minutes at 120° C.

The following are found: et (min) 1.5 min.; et (max) 2.5 min.; Δt +1 min.; Δt (rel) +66.6%.

COMPARATIVE EXPERIMENT 9 (FOR COMPARISON WITH EXAMPLE 11)

The procedure described in Example 11 is followed, but no alkylthioanthraquinone or methyl phenylglyoxylate is admixed.

The following are found: et (min) 1.5 min.; et (max) 1.2 min.; Δt −0.3 min.; Δt (rel) −20%.

EXAMPLES 12 AND 13

A 42% strength solution of a mixture of 78% of an elastomeric polyester-polyurethane, 20% of an urethane-acrylate obtained from a hydroxyalkyl acrylate, diisocyanate and polyethylene glycol, serving as the monomer, 1.2% of benzil monodimethylketal, 0.02% of a black dye (Color Index No. 12,195), 0.1% of aluminum salt of N-nitrosocyclohexylhydroxylamine, 0.025% of 2-butylthio-2-anthraquinone (formula II) and 0.18% of methyl phenylglyoxylate in tetrahydrofuran is cast onto (a) a polyester film coated with adhesive (Example 12) and (b) a steel sheet coated with adhesive (Example 13) so as to give, after drying at 80° C. in each case, a layer 700 μm thick which has a solids content of about 98%. Imagewise exposure through an image-bearing transparency is carried out as described in the text preceding the Examples. The unexposed areas are removed by washing out with a mixture of 10 parts by volume of methyl ethyl ketone and 1 part by volume of water. The relief plate is then dried for 30 minutes at 50° C.

The following results are obtained:

|  | EXAMPLE 12 (Polyester film) | EXAMPLE 13 (Steel sheet) |
| --- | --- | --- |
| et (min) | 6 min. | 6 min. |
| et (max) | 10 min. | >20 min. |
| Δt | +4 min. | >+14 min. |
| Δt (rel) | +67% | >+230% |

COMPARATIVE EXPERIMENTS 10 and 11 (FOR COMPARISON WITH EXAMPLES 12 AND 13)

The procedure followed is exactly as described in Examples 12 and 13, but neither alkylthioanthraquinone nor methyl phenylglyoxylate is added.

The following results are obtained:

|  | COMPARATIVE EXPERIMENT 10 (Polyester film) | COMPARATIVE EXPERIMENT 11 (Steel sheet) |
| --- | --- | --- |
| et (min) | 4 min. | 6 min. |
| et (max) | 1 min. | 6 min. |
| Δt | −3 min. | ±0 min. |
| Δt (rel) | −75% | ±0%. |

EXAMPLE 14

The procedure described in Example 1 is followed, but 0.3% of the potassium salt of N-nitrosocyclohexylhydroxylamine and 0.03% of phenylthio-2-anthraquinone are added to the solution of polyamide, plasticizer and photoinitiator. No dye is added. The resulting layer of the photopolymerizable composition is 500 μm thick when dry.

The following results are obtained: et (min) 3.5 min.; et (max) 4.5 min.; Δt +1.0 min.; Δt (rel) +29%.

EXAMPLE 15

The procedure described in the above Example 14 is followed, but 0.03% of 2-(β-hydroxyethyl-thio)-anthraquinone is added to the solution of polyamide, plasticizer, photoinitiator and thermal polymerization inhibitor.

The following results are obtained: et (min) 3.5 min.; et (max) 5.7 min.; Δt +2.2 min.; Δt (rel) +63%.

EXAMPLE 16

The procedure described in the above Example 14 is followed, but instead of phenylthio-2-anthraquinone, 0.03% of 2-(β-hydroxy-α-methyl-ethylthio)-anthraquinone is added.

EXAMPLE 17

The procedure described in the above Example 14 is followed, but instead of phenylthio-2-anthraquinone, 0.03% of 2-(β-acetoxyethylthio)-anthraquinone is added.

The following results are obtained: et (min) 3.5 min.; et (max) 14 min.; Δt +10.5 min.; Δt (rel) +300%.

EXAMPLE 18

The procedure described in the above Example 14 is followed, but instead of phenylthio-2-anthraquinone, 0.03% of 2-(methoxycarbonyl-methylthio)-anthraquinone is added.

The following results are obtained: et (min) 2.25 min.; et (max) 6 min.; Δt +3.75 min.; Δt (rel) +167%.

COMPARATIVE EXPERIMENT

The procedure described in the above Example 14 is followed, but no anthraquinone thioether is added.

The following results are obtained: et (min) 2.0 min.; et (max) 0.5 min.; Δt −1.5 min.; Δt (rel) −75%.

We claim:

1. A photopolymerizable composition for the manufacture of printing plates and relief plates, consisting essentially of:
   (a) a photoinitiator,
   (b) at least one, photopolymerizable olefinically unsaturated monomer,
   (c) at least one organic polymeric binder compatible with said monomer, and
   (d) from about 0.001 to 0.1 percent by weight, based on the total mixture of said components (a), (b) and (c), distributed homogeneously in said mixture, of an etherified thioanthraquinone of the formula

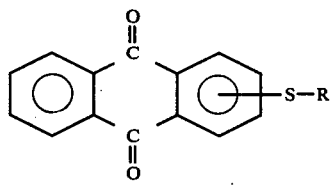

wherein R is alkyl of 1 to 12 carbon atoms, alkyl of 1 to 8 carbon atoms which is substituted by a free, etherified or esterified hydroxyl group or by an alkoxycarbonyl group, or unsubstituted or substituted phenyl.

2. A photopolymerizable composition for the manufacture of printing plates and relief plates, consisting essentially of:
   (a) a photoinitiator;
   (b) at least one photopolymerizable olefinically unsaturated monomer;
   (c) at least one organic polymeric binder compatible with said monomer;
   (d) from about 0.001 to 0.1 percent by weight, based on the total mixture of said components (a), (b) and (c), distributed homogeneously in said mixture, of an etherified thioanthraquinone of the formula

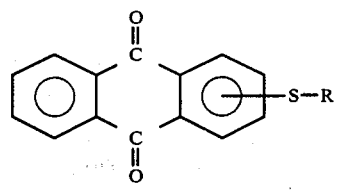

wherein R is alkyl of 1 to 12 carbon atoms, alkyl of 1 to 8 carbon atoms which is substituted by a free, etherified or esterified hydroxyl group or by an alkoxycarbonyl group, or unsubstituted or substituted phenyl; and
   (e) from about 0.01 to 1 percent by weight based on the total composition, of an organic tertiary amine or of an aromatic α-ketocarboxylic acid or its alkyl ester, where the alkyl is of 1 to 8 carbon atoms.

3. A photopolymerizable composition for the manufacture of printing plates and relief plates, consisting essentially of:
   (a) a photoinitiator;
   (b) at least one photopolymerizable olefinically unsaturated monomer;
   (c) at least one organic polymeric binder compatible with said monomer;
   (d) from about 0.001 to 0.1 percent by weight, based on the total mixture of said components (a), (b) and (c), distributed homogeneously in said mixture, of an etherified thioanthraquinone of the formula

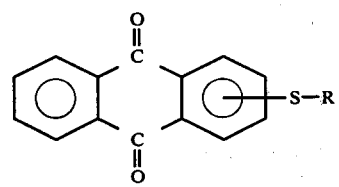

wherein R is alkyl of 1 to 12 carbon atoms, alkyl of 1 to 8 carbon atoms which is substituted by a free, etherified or esterified hydroxyl group or by an alkoxycarbonyl group, or unsubstituted or substituted phenyl; and
   (e) from about 0.002 to 2 percent by weight, based on the total composition, of a salt of an organic N-nitrosohydroxylamine.

4. The composition of claim 1 or 2 or 3, wherein said monomer boils at about 100° C. at atmospheric pressure.

5. The composition of claim 1 or 2 or 3, wherein the amount of photoinitiator used is from 0.01 to 10% by weight, based on the weight of components (b) and (c) together.

6. The composition of claims 1 or 2 or 3, wherein the total weight of components (b) and (c) together is made up of from 45 to 90% by weight of the binder and from 10 to 55% by weight of the monomer.

* * * * *

UNITED STATES PATENT AND TRADEMARK OFFICE
CERTIFICATE OF CORRECTION

PATENT NO. : 4,198,241
DATED : April 15, 1980
INVENTOR(S) : BRONSTERT ET AL.

It is certified that error appears in the above—identified patent and that said Letters Patent is hereby corrected as shown below:

Column 12, line 20, change "1 to 8" to --1 to 18--.

Signed and Sealed this

Second Day of September 1980

[SEAL]

Attest:

SIDNEY A. DIAMOND

Attesting Officer    Commissioner of Patents and Trademarks

UNITED STATES PATENT AND TRADEMARK OFFICE
CERTIFICATE OF CORRECTION

PATENT NO. : 4,198,241
DATED : April 15, 1980
INVENTOR(S) : Bernd Bronstert et al.

It is certified that error appears in the above—identified patent and that said Letters Patent is hereby corrected as shown below:

On the cover page, Under the References Cited, U.S. Patent Documents
    the name in the first reference cited should read --McGraw-- and not "McGrew",
    the patent number of the third reference cited should be --3,615,629-- and not "3,615,619", the name in the fifth reference cited should read --McGinniss-- and not "McGinnis", and the patent number of the seventh reference cited should be --3,992,275-- and not "3,991,275".

Signed and Sealed this

Twentieth Day of January 1981

[SEAL]

Attest:

RENE D. TEGTMEYER

Attesting Officer     Acting Commissioner of Patents and Trademarks